(12) United States Patent
Poilvet et al.

(10) Patent No.: US 12,306,682 B2
(45) Date of Patent: May 20, 2025

(54) ON-BOARD COMPUTER WITH INTERPOSER ON THE MICROPROCESSOR CHIP

(71) Applicant: SAFRAN ELECTRONICS & DEFENSE, Paris (FR)

(72) Inventors: Christophe Poilvet, Moissy-Cramayel (FR); Nicolas Charrier, Moissy-Cramayel (FR); Michael Montoya, Moissy-Cramayel (FR)

(73) Assignee: SAFRAN ELECTRONICS & DEFENSE, Paris (FR)

( * ) Notice: Subject to any disclaimer, the term of this patent is extended or adjusted under 35 U.S.C. 154(b) by 278 days.

(21) Appl. No.: 17/778,528

(22) PCT Filed: Nov. 20, 2020

(86) PCT No.: PCT/FR2020/052142
§ 371 (c)(1),
(2) Date: May 20, 2022

(87) PCT Pub. No.: WO2021/099750
PCT Pub. Date: May 27, 2021

(65) Prior Publication Data
US 2022/0413574 A1    Dec. 29, 2022

(30) Foreign Application Priority Data
Nov. 21, 2019   (FR) ...................... 1913042

(51) Int. Cl.
*G06F 1/20* (2006.01)
*H01L 23/367* (2006.01)
*H05K 7/20* (2006.01)

(52) U.S. Cl.
CPC ............ *G06F 1/206* (2013.01); *H01L 23/367* (2013.01); *H05K 7/2039* (2013.01)

(58) Field of Classification Search
CPC ......... H05K 7/2039; G06F 1/206; G06F 1/20; H01L 23/473; H01L 23/3128;
(Continued)

(56) References Cited

U.S. PATENT DOCUMENTS

| | | | | |
|---|---|---|---|---|
| 4,745,456 A | * | 5/1988 | Clemens | ............ H01L 23/4093 257/722 |
| 5,067,007 A | * | 11/1991 | Otsuka | ............ H01L 23/49555 257/E23.09 |

(Continued)

FOREIGN PATENT DOCUMENTS

DE   20 2009 000 460 U1   4/2009

OTHER PUBLICATIONS

Malico; 'Heat dissipation assembly', Apr. 30, 2009, Malico Inc, Description (Espacenet Machine Translation of DE 202009000460 U1) (Year: 2009).*

(Continued)

*Primary Examiner* — Stephen S Sul
*Assistant Examiner* — Jeffrey Francis Stoll
(74) *Attorney, Agent, or Firm* — Sughrue Mion, PLLC

(57) ABSTRACT

An on-board computer includes a microprocessor chip with a lower face and an upper face, a chip carrier having an upper face on which the microprocessor chip is mounted, and a casing configured to discharge heat generated by the microprocessor chip in operation. An interposer is disposed between the upper face and the casing. The interposer diffuses the heat transmitted by the upper face of the microprocessor chip towards the casing. The interposer has an upper surface for heat exchange with the casing that is twice or more greater than the surface area of the upper face of the microprocessor chip. The interposer has on one or more sides a peripheral wedging rim coming into contact with a side wall of the chip carrier, and has no more than two (Continued)

peripheral wedging rims, in order to leave the other sides of the interposer free.

10 Claims, 2 Drawing Sheets

(58) Field of Classification Search
CPC ..... H01L 23/3675; H01L 23/34; H01L 25/18; H01L 23/49805; H01L 23/427
See application file for complete search history.

(56) References Cited

U.S. PATENT DOCUMENTS

| | | | | |
|---|---|---|---|---|
| 5,397,919 | A * | 3/1995 | Tata | H01L 23/4093 257/E23.084 |
| 5,703,397 | A * | 12/1997 | Endo | H01L 23/49838 257/E23.113 |
| 5,990,418 | A * | 11/1999 | Bivona | H01L 23/16 174/547 |
| 7,019,967 | B2 * | 3/2006 | DiFonzo | G06F 1/1662 174/544 |
| 2005/0068739 | A1 | 3/2005 | Arvelo et al. | |
| 2005/0256241 | A1 * | 11/2005 | Sachdev | H01L 23/433 257/E23.09 |
| 2007/0017659 | A1 * | 1/2007 | Brunschwiler | H01L 23/427 165/80.4 |
| 2008/0116570 | A1 | 5/2008 | Awad et al. | |
| 2009/0195987 | A1 * | 8/2009 | Liang | H01L 23/4093 361/707 |
| 2010/0172105 | A1 * | 7/2010 | Liang | H01L 23/4093 361/719 |
| 2010/0172106 | A1 * | 7/2010 | Liang | H01L 23/4093 361/719 |
| 2012/0026668 | A1 * | 2/2012 | Landon | G06F 1/187 361/679.31 |
| 2013/0105964 | A1 | 5/2013 | Seki | |
| 2014/0022733 | A1 * | 1/2014 | Lim | H05K 7/20445 361/718 |
| 2015/0084182 | A1 * | 3/2015 | De Cecco | H01L 23/4093 438/122 |
| 2015/0289413 | A1 * | 10/2015 | Rush | B22F 10/20 165/53 |

OTHER PUBLICATIONS

"Adjacent." Merriam-Webster.com Dictionary, Merriam-Webster, https://www.merriam-webster.com/dictionary/adjacent. Accessed Oct. 2, 2024. (Year: 2024).*
"Interpose." Merriam-Webster.com Dictionary, Merriam-Webster, https://www.merriam-webster.com/dictionary/interpose. Accessed Oct. 3, 2024. (Year: 2024).*
International Search Report dated Feb. 9, 2021 in International Application No. PCT/FR2020/052142.
Written Opinion of the International Searching Authority dated Feb. 9, 2021 in International Application No. PCT/FR2020/052142.
French Search Report dated Jun. 24, 2020 in French Application No. 1913042.

* cited by examiner

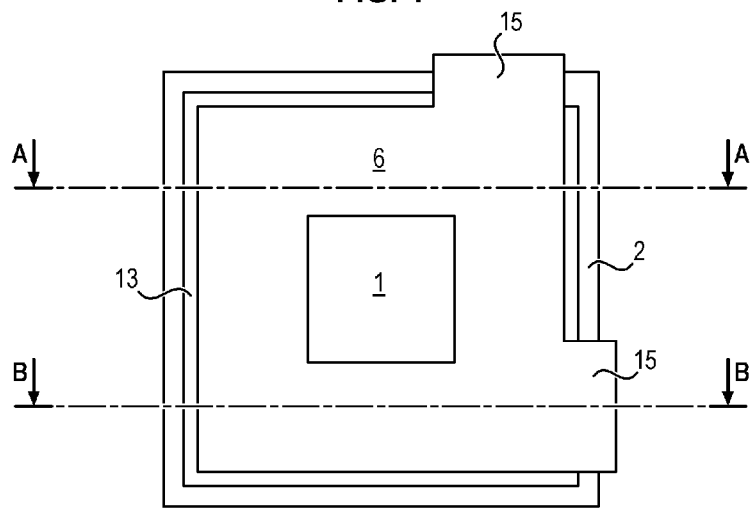
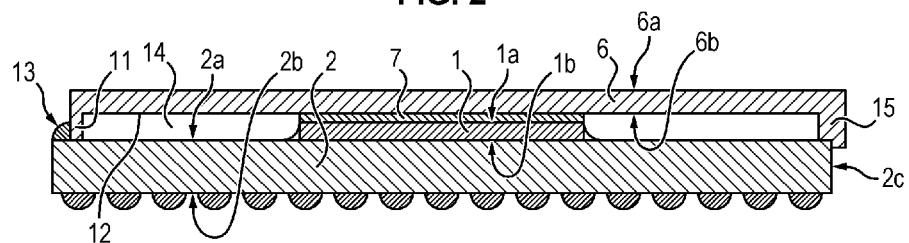
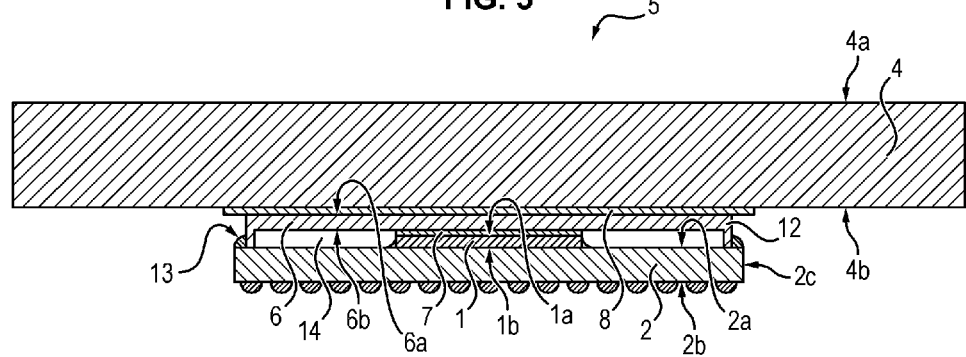

ON-BOARD COMPUTER WITH INTERPOSER ON THE MICROPROCESSOR CHIP

CROSS REFERENCE TO RELATED APPLICATIONS

This application is a National Stage of International Application No. PCT/FR2020/052142 filed Nov. 20, 2020, claiming priority based on French Patent Application No. 1913042 filed Nov. 21, 2019, the contents of each of which are herein incorporated by reference in their entireties.

TECHNICAL FIELD

The present invention relates to the field of on-board electrical equipment and more specifically to an on-board computer comprising a microprocessor chip, a chip carrier, and a casing discharging the heat generated by the chip during its operation, the computer being on board an air vehicle like an aircraft or a land vehicle like a machine equipped with wheels or caterpillar tracks.

An on-board computer must be able to ensure the operation intended for it while facing a certain number of constraints. An on-board computer must particularly:
- offer high availability regardless of the environmental conditions of the vehicle,
- have a small space requirement,
- be robust to the effects induced by the operation of the vehicle (vibrations, high temperatures),
- take place in a confined environment.

These constraints induce problems for various aspects related to the operation of a computer. Particularly, any microprocessor chip, during its operation, generates heat which can reach more than 100° C. However, the constraints that an on-board computer must face can make the discharge of this heat difficult.

Indeed, it is often not possible, for reasons of reliability and confinement, to use a supply of cooling fluid, such as for example a stream of outside air, the casing of the computer being generally sealed. In addition, a fluid circulation device, typically a fan or a pump, is subject to failures which cannot be accepted for an on-board computer whose reliability is critical for the vehicle.

An on-board computer is therefore generally cooled by contact thermal diffusion which consists in transmitting the heat generated by the microprocessor chip to the casing of the computer. A radiator is therefore placed in contact with the microprocessor chip to drain the heat therefrom. However, this type of cooling requires a contact between the radiator and the microprocessor chip which extends uniformly over the entire surface of the microprocessor chip. However, like any mechanical system, clearances are provided between the different components (microprocessor chip, chip carrier, radiator, casing, etc.) in order to allow the adaptation to the dimensional tolerances and to allow the mounting of the computer.

Elastic elements such as springs or gel can be provided to take up the different clearances between the components, and to ensure the mechanical holding of the components. Due to the fact that the computer is an on-board computer, the computer is however subjected to strong vibrations induced by the operation of the vehicle. Due to these vibrations and to the elasticity of the elastic elements, the components of the computer may undergo relative displacements which jeopardize the cooling of the microprocessor chip.

Another solution is to provide for very low manufacturing tolerances, with strict compliance with very accurate dimensions. Such a requirement however considerably increases the manufacturing costs, complicates the mounting, and can pose problems regarding the thermal expansion. Furthermore, in order to compensate for the inevitable dimensional tolerances, the thermal pad disposed between the microprocessor chip and the casing must be thick, which reduces the efficiency of heat discharge towards the casing.

Patent application US2013/0105964 describes a semiconductor device in which a radiator plate is disposed between a semiconductor element and a heat sink, the radiator plate forming a heat diffuser. However, the mounting of such a radiator plate in contact with the semiconductor element is complex and remaining imperfections are detrimental to the efficiency of the cooling.

SUMMARY OF THE DISCLOSURE

The invention aims to allow an on-board computer to effectively cool its microprocessor chip in a way that is robust to vibrations, without movable element, and without requiring complex and expensive manufacture or mounting.

To this end, the invention proposes an on-board computer comprising a microprocessor chip with a lower face and an upper face, a chip carrier having an upper face on which the microprocessor chip is mounted, and a casing configured to discharge the heat generated by the microprocessor chip in operation, in which an interposer is disposed between the upper face of the microprocessor chip and the casing of the computer, the interposer being carried by the upper face of the microprocessor chip and being configured to diffuse the heat transmitted by the upper face of the microprocessor chip towards the casing of the computer, the interposer having an upper surface for heat exchange with the casing of the computer which is at least twice greater than the surface area of the upper face of the microprocessor chip, and in which the interposer has at least on one side a peripheral wedging rim coming into contact with a side wall of the chip carrier, the interposer having no more than two peripheral wedging rims, in order to leave the other sides of the interposer free.

The invention is advantageously supplemented by the various following characteristics taken alone or according to their various possible combinations:
- the interposer has an upper surface for heat exchange with the casing of the computer which is at least four times greater than the surface area of the upper face of the microprocessor chip;
- the interposer is metallic;
- the interposer has at least one peripheral wedging rim coming into contact with a side wall of the chip carrier;
- the chip carrier comprises at least two adjacent side faces, and the interposer has two peripheral wedging rims each coming into contact with a respective side wall of the chip carrier;
- a peripheral wedging rim does not extend over the entire side of the interposer where it is located;
- a thermal paste is disposed between the microprocessor chip and the interposer;
- a thermal pad is disposed between the interposer and the casing of the computer;
- an adhesive material holds at least part of a periphery of the interposer with the upper face of the chip carrier;
- the interposer has a planar upper face, and a lower face whose periphery has an extra thickness and whose center defines a cavity accommodating the upper face of the microprocessor chip;

the peripheral wedging rim extends the interposer radially with respect to the center beyond the periphery, so that the peripheral wedging rim protrudes from the upper face of the chip carrier;

the center of the interposer has a thickness comprised between 1 mm and 2 mm, and the periphery of the interposer has a thickness comprised between 2 mm and 4 mm.

BRIEF DESCRIPTION OF THE FIGURES

Other characteristics, aims and advantages of the invention will become apparent from the following description which is purely illustrative and not limiting and which should be read in relation to the appended drawings in which:

FIG. 1 is a top view showing the chip carrier, the interposer and the microprocessor chip, according to one possible embodiment of the invention;

FIG. 2 is a view along the section BB of FIG. 1;

FIG. 3 is a view along the section AA of FIG. 1, including the thermal pad and the casing;

DETAILED DESCRIPTION

Figure 4:
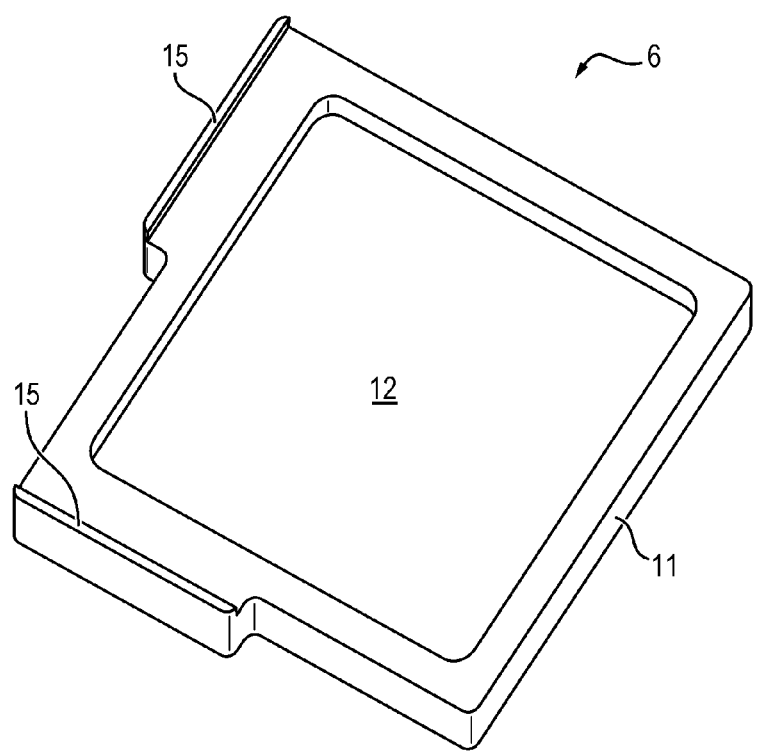
FIG. 4 is a perspective view of the interposer according to one possible embodiment of the invention.

Referring to FIGS. 1 to 3, the on-board computer comprises a microprocessor chip 1 with a lower face 1a and an upper face 1b. A microprocessor chip is an integrated circuit that incorporates the functions of a computer central processing unit, and which executes instructions and processes data. The microprocessor chip 1 can be of any type, and can for example be dedicated to signal communication or processing functions.

The microprocessor chip 1 is mounted on a chip carrier 2, and more specifically on the upper face 2a of the chip carrier 2. In the example illustrated, the microprocessor chip 1 is of the flip chip type, and the lower face 2b of the chip carrier 2 is provided with solder balls 3 allowing the connection of the microprocessor chip 1 with other electronic components (other computer, sensors, actuators, etc.) as well as its power supply.

The on-board computer also comprises a casing 4, visible in FIG. 3, which is configured to discharge the heat generated by the microprocessor chip in operation towards the environment 5 outside the computer, via the upper face 4a of the casing. The casing 4 may have fins or another device that allows increasing the exchange surface to maximize the heat transfers between the casing 4 and the external environment 5. The external environment 5 is preferably air, but can be any type of environment that allows discharging the heat. The casing 4 typically consists of metal, whose good thermal conduction allows it to ensure its role as a heat sink.

An interposer 6 is disposed between the upper face 1a of the microprocessor chip 1 and the lower face 4b of the casing 4. The interposer is configured to diffuse the heat transmitted by the upper face 1a of the microprocessor chip towards the casing 4. As such, the interposer 6 can also be designated as a heat diffuser. Preferably, as illustrated in FIG. 1, the microprocessor chip 1 is substantially centered on the chip carrier 2, and the interposer 6 is substantially centered on the chip carrier 2, so that the microprocessor chip 1 is substantially at the center of the interposer 6, which favors a homogeneous discharge of the heat. It should be noted that the microprocessor chip 1 appears in FIG. 1 for illustrative purposes, the latter being normally concealed by the interposer 6 resting thereon. As illustrated, the interposer 6 preferably shares the same shape as the chip carrier 2, and substantially the same size. Typically, the chip carrier 2 and the interposer 6 have the shapes of quadrilaterals (squares or rectangles).

A thermal paste 7 is disposed between the upper face 1a of the microprocessor chip 1 and the interposer 6. The thermal paste 7 can comprise metal fillers, and is for example a polymer or ceramic paste loaded with metal, typically silver, copper or aluminum compounds. Other compositions can be used. The thermal paste 7 allows filling the micro-porosities due to the roughness of the upper face 1a of the microprocessor chip 1 and of the lower face 6b of the interposer 6, with a substance whose thermal conductivity is much higher than that of the air, thereby improving heat transfer. However, contrary to the state of the art, the thermal paste 7 here does not have the role of correcting the unevenness of the upper face 1a of the microprocessor chip 1 or of the lower surface 4b of the casing 4 caused by the manufacturing tolerances. The thermal paste 7 can thus be present over a very small thickness, typically less than 1 mm, even less than 0.5 mm or than 0.3 mm.

A thermal pad 8 is disposed between the interposer 6 and the casing 4, and more specifically between the upper face 6a of the interposer 6 and the lower face 4b of the casing 4. The thermal pad 8 is for example a non-conductive paste to avoid short circuits. Other compositions can be used. Just like the thermal paste 7, the thermal pad 8 serves as a heat seal, here between the interposer 6 and the casing 4 in order to facilitate heat transfers from the interposer 6 to the casing 4. The thermal pad 8 can on the other hand be used to remedy the slight unevenness that could exist on the upper face 6a of the interposer 6 and the lower face 4b of the casing 4. As such, the thermal pad 8 can be thicker than the thermal paste 7. It should be noted that the thermal pad 8 has a greater thickness than the thermal paste 7.

The heat generated by the microprocessor chip 1 during its operation is transferred to the interposer 6 that transfers this heat to the casing 4. In order to improve the discharge of heat, the interposer 6 has an upper surface for heat exchange with the casing 4 which is at least twice greater than the surface area of the upper face 1a of the microprocessor chip 1, and preferably at least four times greater than the surface area of the upper face 1a of the microprocessor chip 1. This upper heat exchange surface is constituted by the upper face 6a of the interposer. The largest upper heat exchange surface allows effectively discharging the heat from the interposer 6 to the casing 4, thus cooling the interposer 6 and therefore improving the cooling of the microprocessor chip 1. This is all the more advantageous that the thermal pad 8 forms a less effective heat seal than the layer of thermal paste 7, that is to say with less thermal conductivity, in particular because of its greater thickness. The increase in the surface for heat exchange with the casing 4, as well as the reduction in the thickness of the thermal paste 7, allowed by the interposer 6, substantially improves the heat transfers between the microprocessor chip 1 and the casing 4.

Indeed, due to the increasing miniaturization of the microprocessor chips, the upper face 1a of a microprocessor chip 1 has generally a very small surface area, and the heat exchanges with the casing 4 are then restricted to this small surface area, which hinders the cooling of the microprocessor chip 1. The interposer 6 allows increasing the surface for heat exchange with the casing 4 by several times. For example, while a microprocessor chip 1 has an upper face 1*a* of 5×5 mm on each side, the interposer 6 can for example have an upper face 6*a*, in contact with the casing 4 via the thermal pad 8, of 20×20 mm on each side, i.e. a 16-fold increase.

The interposer 6 is preferably made in one piece. The interposer 6 consists of a material having good thermal conduction, and is typically made of metal. More particularly, the interposer 6 can be made of copper or aluminum, which combine good thermal conduction and good rigidity for making a thin and rigid interposer.

FIG. 4 shows one example of an interposer 6 according to one advantageous and non-limiting embodiment of the invention. FIG. 4 shows the lower side of the interposer 6, that is to say the side of the microprocessor chip 1 and of the chip carrier 2. On the opposite side, not represented in FIG. 4, the interposer 6 has an upper face 6*a* which is preferably planar and smooth in order to maximize the surface for heat exchange with the casing 4.

On the side visible in FIG. 4, the interposer 6 has a lower face 6*b* which is preferably not planar. The lower face 6*b* can have a periphery 11 having an extra thickness and a center 12 defining a cavity accommodating the upper face 1*a* of the microprocessor chip 1. In width, the periphery 11 represents less than 20% of the half-diameter of the lower face 6*b* of the interposer 6. The periphery 11 is preferably thickened over the majority of the periphery of the interposer 6, and the thickened part is preferably closed, thus forming a frame rigidifying the interposer 6, which allows providing for a center 12 of small thickness while maintaining the rigidity necessary to ensure the flatness of the upper face 6*a* of the interposer 6 necessary for good contact with the casing 4 via the thermal pad 8. The small thickness of the center 12 allows improving the thermal conductivity between the microprocessor chip 1 and the casing 4. Typically, the center 12 has a thickness less than half the extra thickness of the periphery 11. By way of example, the center 12 of the interposer 6 can have a thickness comprised between 1 mm and 2 mm, and the periphery 11 of the interposer 6 can have a thickness comprised between 2 mm and 4 mm.

The thickened periphery 11 therefore forms a projection towards the chip carrier 2, but preferably does not serve to carry the interposer 6. Indeed, the extra thickness of the periphery 11 with respect to the center 12 does not exceed the elevation of the microprocessor chip 1 above the chip carrier 2. The interposer 6 is carried by the upper face 1*a* of the microprocessor chip 1: the interposer 6 rests on the upper face 1*a* of the microprocessor chip 1 (via the layer of thermal paste 7) by its center 12, and not on the chip carrier 2 by its periphery 11.

The thickened periphery 11 however preferably extends very close to the chip carrier 2. An adhesive material 13 holds at least part of the periphery 11 of the interposer 6 with the upper face 2*a* of the chip carrier 2. The adhesive material 13 is typically a bead of glue. Around the microprocessor chip 1, the center 12 of the lower face 6*b* of the interposer 6 faces the upper face 2*a* of the chip carrier 2 and is spaced therefrom, thus defining a free space 14 around the microprocessor chip 1. This free space 14 is filled with air, and allows lightening the assembly formed by the chip carrier 2, the microprocessor chip 1 and the interposer 6. In addition, the presence of air around the microprocessor chip 1 allows the paste to flow and to lighten the weight of the assembly.

The interposer 6 further comprises at least one peripheral wedging rim 15 coming into contact with a side wall 2*c* of the chip carrier 2, as illustrated in FIG. 2. This side wall 2*c* of the chip carrier 2 connects the upper face 2*a* and the lower face 2*b* of the chip carrier 2. The peripheral wedging rim 15 extends the interposer 6 radially with respect to the center 12 beyond the periphery 11, so that the peripheral wedging rim 15 protrudes from the upper face 2*a* of the chip carrier 2, as shown in FIG. 1. The peripheral wedging rim 15 extends on the side opposite to the upper face 6*a* of the interposer 6 over a distance with respect to the center 12 of the interposer 6 greater than that of the elevation of the microprocessor chip 1 on the chip carrier 2, and thus comes against the side wall 2*c* of the chip carrier 2.

The peripheral wedging rim 15 serves as a positioning reference during the installation of the interposer 6 on the microprocessor chip 1: it suffices to slide the interposer 6 on the upper face 1*a* of the microprocessor chip 1 until the peripheral wedging rim 15 comes into contact with the side wall 2*c* of the chip carrier 2. The peripheral wedging rim 15 therefore allows easily ensuring the positioning of the interposer 6 in the direction perpendicular to its contact with the side wall 2*c* of the chip carrier 2. Preferably, in order to allow the wedging in the two directions perpendicular to two adjacent side faces of the chip carrier 2, the interposer 6 has two peripheral wedging rims 15 each coming into contact with a respective side wall 2*c* of the chip carrier 2, as illustrated in FIG. 4. However, the interposer 6 preferably has no more than two peripheral wedging rims 15, in order to leave the other sides of the interposer 6 free in order to facilitate the mounting and not to add additional dimensioning constraints.

Preferably, a peripheral wedging rim 15 does not extend over the entire side of the interposer 6 where it is located, more preferably over less than half of this side.

The invention is not limited to the embodiment described and represented in the appended figures. Modifications remain possible, in particular from the point of view of the constitution of the various technical characteristics or by substitution of technical equivalents, without departing from the scope of protection of the invention.

The invention claimed is:

1. An on-board computer comprising a microprocessor chip with a lower face and an upper face, a quadrilateral chip carrier having at least two lateral adjacent side walls with a common endpoint and an upper face on which the microprocessor chip is mounted, and a casing configured to discharge heat generated by the microprocessor chip in operation, wherein an interposer is disposed between the upper face of the microprocessor chip and the casing of the on-board computer, the interposer being carried by the upper face of the microprocessor chip and having a thickened periphery and a center forming a cavity accommodating the upper face of the microprocessor chip, said interposer resting on the upper face of the microprocessor chip and not on the chip carrier by the thickened periphery, said interposer being configured to diffuse the heat transmitted by the upper face of the microprocessor chip towards the casing of the on-board computer, the interposer having an upper surface for heat exchange with the casing of the on-board computer and a surface area of the upper surface of the interposer is at least twice greater than a surface area of the upper face of the microprocessor chip, and wherein the interposer has on two adjacent sides with a common endpoint two peripheral wedging rims extending on a side opposite to the upper face of the interposer, beyond the thickened periphery and each coming into contact with against a respective lateral adjacent side wall of the chip carrier thereby serving as a positioning reference in two directions perpendicular to the two adjacent side walls of the chip carrier, the interposer having no more than two peripheral wedging rims, in order to leave other sides of the interposer free, thereby allowing the installation of the interposer through sliding of the interposer on the upper face of the microprocessor chip until the peripheral wedging rims come into contact with the side walls of the chip carrier, and configured to permit air to enter a free space defined by a lower face of the interposer and the upper face of the chip carrier.

2. The on-board computer according to claim 1, wherein the upper surface of the interposer is at least four times greater than the surface area of the upper face of the microprocessor chip.

3. The on-board computer according to claim 1, wherein each of the two peripheral wedging rims does not extend over an entire side of the interposer where it is located.

4. The on-board computer according to claim 1, wherein a thermal paste is disposed between the microprocessor chip and the interposer.

5. The on-board computer according to claim 1, wherein a thermal pad is disposed between the interposer and the casing of the on-board computer.

6. The on-board computer according to claim 1, wherein an adhesive material holds at least part of the thickened periphery of the interposer with the upper face of the chip carrier.

7. The on-board computer according to claim 1, wherein the upper surface of the interposer is planar, and the lower face of the interposer comprises: the thickened periphery, which has an extra thickness; and the center forming the cavity accommodating the upper face of the microprocessor chip.

8. The on-board computer according to claim 7, wherein each of the two peripheral wedging rims extends the interposer radially with respect to the center beyond the thickened periphery, so that each of the two peripheral wedging rims protrudes from the upper face of the chip carrier.

9. The on-board computer according to claim 7, wherein the center of the interposer has a thickness comprised between 1 mm and 2 mm, and the thickened periphery of the interposer has a thickness comprised between 2 mm and 4 mm.

10. The on-board computer according to claim 1, wherein the two peripheral wedging rims serve as the positioning reference by, when the interposer is installed by the sliding of the interposer on the upper face of the microprocessor chip, the two peripheral wedging rims do not contact the chip carrier, and when the interposer is in a position to diffuse the heat, the two peripheral wedging rims contact against the respective lateral adjacent side wall of the chip carrier.

* * * * *